(12) United States Patent
Malhotra et al.

(10) Patent No.: US 8,435,854 B1
(45) Date of Patent: May 7, 2013

(54) TOP ELECTRODE TEMPLATING FOR DRAM CAPACITOR

(75) Inventors: Sandra Malhotra, San Jose, CA (US);
Hanhong Chen, Milpitas, CA (US);
Wim Deweerd, San Jose, CA (US);
Hiroyuki Ode, Higashihiroshima (JP)

(73) Assignees: Intermolecular, Inc., San Jose, CA (US); Elpida Memory, Inc., Tokyo (JP)

( * ) Notice: Subject to any disclaimer, the term of this patent is extended or adjusted under 35 U.S.C. 154(b) by 0 days.

(21) Appl. No.: 13/294,309

(22) Filed: Nov. 11, 2011

(51) Int. Cl.
*H01L 21/8242* (2006.01)

(52) U.S. Cl.
USPC ............ 438/240; 257/E21.008; 257/E21.011; 257/E21.396; 257/E21.647; 438/239; 438/253; 438/381; 438/396; 438/674

(58) Field of Classification Search ............ 257/E21.008, 257/E21.011, E21.396, E21.647; 438/239, 438/240, 253, 381, 396, 674
See application file for complete search history.

(56) References Cited

U.S. PATENT DOCUMENTS

| | | | |
|---|---|---|---|
| 2002/0098711 A1* | 7/2002 | Klein | 438/758 |
| 2007/0096189 A1* | 5/2007 | Iwasaki et al. | 257/306 |
| 2009/0065896 A1* | 3/2009 | Hwang | 257/532 |

* cited by examiner

*Primary Examiner* — Asok K Sarkar

(57) ABSTRACT

A method for forming a DRAM MIM capacitor stack having low leakage current involves the use of a first electrode that serves as a template for promoting the high k phase of a subsequently deposited dielectric layer. The high k dielectric layer comprises a doped material that can be crystallized after a subsequent annealing treatment. A metal oxide second electrode layer is formed above the dielectric layer. The metal oxide second electrode layer has a crystal structure that is compatible with the crystal structure of the dielectric layer. Optionally, a second electrode bulk layer is formed above the metal oxide second electrode layer.

21 Claims, 6 Drawing Sheets

TOP ELECTRODE TEMPLATING FOR DRAM CAPACITOR

This document relates to the subject matter of a joint research agreement between Intermolecular, Inc. and Elpida Memory, Inc.

FIELD OF THE INVENTION

The present invention relates generally to the use of top electrodes that have crystal structures that are compatible with rutile phase $TiO_2$ high k dielectric materials used in capacitors used in Dynamic Random Access Memory (DRAM) devices.

BACKGROUND OF THE INVENTION

Dynamic Random Access Memory utilizes capacitors to store bits of information within an integrated circuit. A capacitor is formed by placing a dielectric material between two electrodes formed from conductive materials. A capacitor's ability to hold electrical charge (i.e., capacitance) is a function of the surface area of the capacitor plates A, the distance between the capacitor plates d (i.e. the physical thickness of the dielectric layer), and the relative dielectric constant or k-value of the dielectric material. The capacitance is given by:

$$C = \kappa \varepsilon_o \frac{A}{d} \quad \text{(Eqn. 1)}$$

where $Å_o$ represents the vacuum permittivity.

The dielectric constant is a measure of a material's polarizability. Therefore, the higher the dielectric constant of a material, the more electrical charge the capacitor can hold. Therefore, for a given desired capacitance, if the k-value of the dielectric is increased, the area of the capacitor can be decreased to maintain the same cell capacitance. Reducing the size of capacitors within the device is important for the miniaturization of integrated circuits. This allows the packing of millions (mega-bit (Mb)) or billions (giga-bit (Gb)) of memory cells into a single semiconductor device. The goal is to maintain a large cell capacitance (generally ~10 to 25 fF) and a low leakage current (generally $<10^{-7}$ A cm$^{-2}$). The physical thickness of the dielectric layers in DRAM capacitors could not be reduced unlimitedly in order to avoid leakage current caused by tunneling mechanisms which exponentially increases as the thickness of the dielectric layer decreases.

Traditionally, $SiO_2$ has been used as the dielectric material and semiconducting materials (semiconductor-insulator-semiconductor [SIS] cell designs) have been used as the electrodes. The cell capacitance was maintained by increasing the area of the capacitor using very complex capacitor morphologies while also decreasing the thickness of the $SiO_2$ dielectric layer. Increases of the leakage current above the desired specifications have demanded the development of new capacitor geometries, new electrode materials, and new dielectric materials. Cell designs have migrated to metal-insulator-semiconductor (MIS) and now to metal-insulator-metal (MIM) cell designs for higher performance.

Typically, DRAM devices at technology nodes of 80 nm and below use MIM capacitors wherein the electrode materials are metals. These electrode materials generally have higher conductivities than the semiconductor electrode materials, higher work functions, exhibit improved stability over the semiconductor electrode materials, and exhibit reduced depletion effects. The electrode materials must have high conductivity to ensure fast device speeds. Representative examples of electrode materials for MIM capacitors are metals, conductive metal oxides, conductive metal silicides, conductive metal nitrides (i.e. TiN), or combinations thereof. MIM capacitors in these DRAM applications utilize insulating materials having a dielectric constant, or k-value, significantly higher than that of $SiO_2$ (k=3.9). For DRAM capacitors, the goal is to utilize dielectric materials with k values greater than about 40. Such materials are generally classified as high-k materials. Representative examples of high-k materials for MIM capacitors are non-conducting metal oxides, non-conducting metal nitrides, non-conducting metal silicates or combinations thereof. These dielectrics may also include additional dopant materials.

One class of high-k dielectric materials possessing the characteristics required for implementation in advanced DRAM capacitors are high-k metal oxide materials. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $SiN_y$, SiON, $SrTiO_3$ (STO), $Ta_2O_5$, $TiO_2$, $ZrO_2$, etc. Titanium dioxide ($TiO_2$) is a metal oxide dielectric material which displays significant promise in terms of serving as a high-k dielectric material for implementation in DRAM capacitors.

The dielectric constant of a dielectric material may be dependent upon the crystalline phase(s) of the material. For example, in the case of $TiO_2$, the anatase crystalline phase of $TiO_2$ has a dielectric constant of approximately 40, while the rutile crystalline phase of $TiO_2$ can have a dielectric constant of approximately >80. Due to the higher-k value of the rutile-phase, it is desirable to produce $TiO_2$ based DRAM capacitors with the $TiO_2$ in the rutile-phase. The relative amounts of the anatase phase and the rutile phase can be determined from x-ray diffraction (XRD). From Eqn. 1 above, a $TiO_2$ layer in the rutile-phase could be physically thicker and maintain the desired capacitance. The increased physical thickness is important for lowering the leakage current of the capacitor. The anatase phase will transition to the rutile phase at high temperatures (>8000). However, high temperature processes are undesirable in the manufacture of DRAM devices.

The crystal phase of an underlying layer can be used to influence the growth of a specific crystal phase of a subsequent material if their crystal structures are similar and their lattice constants are similar. This technique is well known in technologies such as epitaxial growth. The same concepts have been extended to the growth of thin films where the underlying layer can be used as a "template" to encourage the growth of a desired phase over other competing crystal phases.

Conductive metal oxides, conductive metal silicides, conductive metal nitrides, or combinations thereof comprise other classes of materials that may be suitable as DRAM capacitor electrodes. Generally, transition metals and their conductive binary compounds form good candidates as electrode materials. The transition metals exist in several oxidation states. Therefore, a wide variety of compounds are possible. Different compounds may have different crystal structures, electrical properties, etc. It is important to utilize the proper compound for the desired application.

In one example, molybdenum has several binary oxides of which $MoO_2$ and $MoO_3$ are two examples. These two oxides of molybdenum have different properties. $MoO_2$ has shown great promise as an electrode material in DRAM capacitors. $MoO_2$ has a distorted rutile crystal structure and serves as an acceptable template to promote the deposition of the rutile-phase of $TiO_2$ as discussed above. $MoO_2$ also has a high work function (can be >5.0 eV depending on process history) which helps to minimize the leakage current of the DRAM device. However, oxygen-rich phases ($MoO_{2+x}$) degrade the performance of the $MoO_2$ electrode because they do not promote the deposition of the rutile-phase of $TiO_2$ and have higher resistivity than $MoO_2$. For example, $MoO_3$ (the most oxygen-rich phase) has an orthorhombic crystal structure and is a dielectric.

Generally, a deposited thin film may be amorphous, crystalline, or a mixture thereof. Furthermore, several different crystalline phases may exist. Therefore, processes (both deposition and post-treatment) must be developed to maximize the formation of crystalline $MoO_2$ and to minimize the presence of $MoO_{2+x}$ phases. Deposition processes and post-treatment processes in a reducing atmosphere have been developed that allow crystalline $MoO_2$ to be used as the first electrode (i.e. bottom electrode) in MIM DRAM capacitors with $TiO_2$ or doped-$TiO_2$ high-k dielectric materials. Examples of the post-treatment process are further described in U.S. application Ser. No. 13/084,666 filed on Apr. 12, 2011, entitled "METHOD FOR FABRICATING A DRAM CAPACITOR" which is incorporated herein by reference. However, these MIM DRAM capacitors have continued to use noble metal (i.e. Ru) materials for the second electrode (i.e. top electrode).

The use of crystalline $MoO_2$ as a second electrode in MIM DRAM capacitors has been difficult due to a number of problems. After the formation of the second electrode, the capacitor stack is then subjected to a post metallization anneal (PMA) treatment. The PMA treatment serves to crystallize the second electrode and to anneal defects in the dielectric and interface states that are formed at the dielectric/second electrode interface during the deposition. Also, if there is no post dielectric anneal (PDA) treatment done before metallization, the PMA treatment can serve to crystallize the dielectric layer to improve the k value and fill oxygen vacancies. Examples of the PDA and PMA treatments are further described in U.S. application Ser. No. 13/159,842 filed on Jun. 14, 2011, entitled "METHOD OF PROCESSING MIM CAPACITORS TO REDUCE LEAKAGE CURRENT" and is incorporated herein by reference. As discussed above, $MoO_2$ is sensitive to oxidation to form oxygen-rich compounds that negatively impacts its performance as an electrode material. The reducing atmosphere anneal processes discussed previously with respect to the use of crystalline $MoO_2$ as a first electrode are not an option at this stage of the device manufacture because they would degrade the performance of the dielectric layer through the formation of oxygen vacancies. $TiO_2$ high k dielectric materials are especially sensitive to processing conditions and increases in the leakage current are observed, likely due to the formation of oxygen vacancies.

The continued use of noble metals (such as Ru) as the second electrode produces an asymmetric capacitor stack. In one example, the asymmetric stack consists of a $MoO_2$ first electrode, a dielectric layer, and a Ru second electrode. The asymmetric stack provides a number of problems. First, Ru is expensive and increases the cost of manufacturing for the DRAM device. Second, the leakage current of the MIM DRAM device increases at high temperatures (i.e. 90 C) to above the desired target of $<10^{-7}$ A $cm^{-2}$ at 1V.

Therefore, there is a need to develop processes that allow the formation of a second electrode material for MIM DRAM devices that lowers the cost, lowers the EOT, and lowers the leakage current at high temperatures (i.e. 90 C).

SUMMARY OF THE DISCLOSURE

In some embodiments of the present invention, a second electrode material comprising a metal oxide layer is formed above a high k dielectric material. The second electrode material may be a single layer or may be a bilayer of a metal oxide layer and a metal layer wherein the metal oxide layer is in contact with the high k dielectric material. The metal oxide layer has a high work function and has a crystal structure that is compatible with rutile phase $TiO_2$ high k dielectric materials.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

In FIGS. 2, 3, 5, and 6 below, a capacitor stack is illustrated using a simple planar structure. Those skilled in the art will appreciate that the description and teachings to follow can be readily applied to any simple or complex capacitor morphology. The drawings are for illustrative purposes only and do not limit the application of the present invention.

Figure 1:
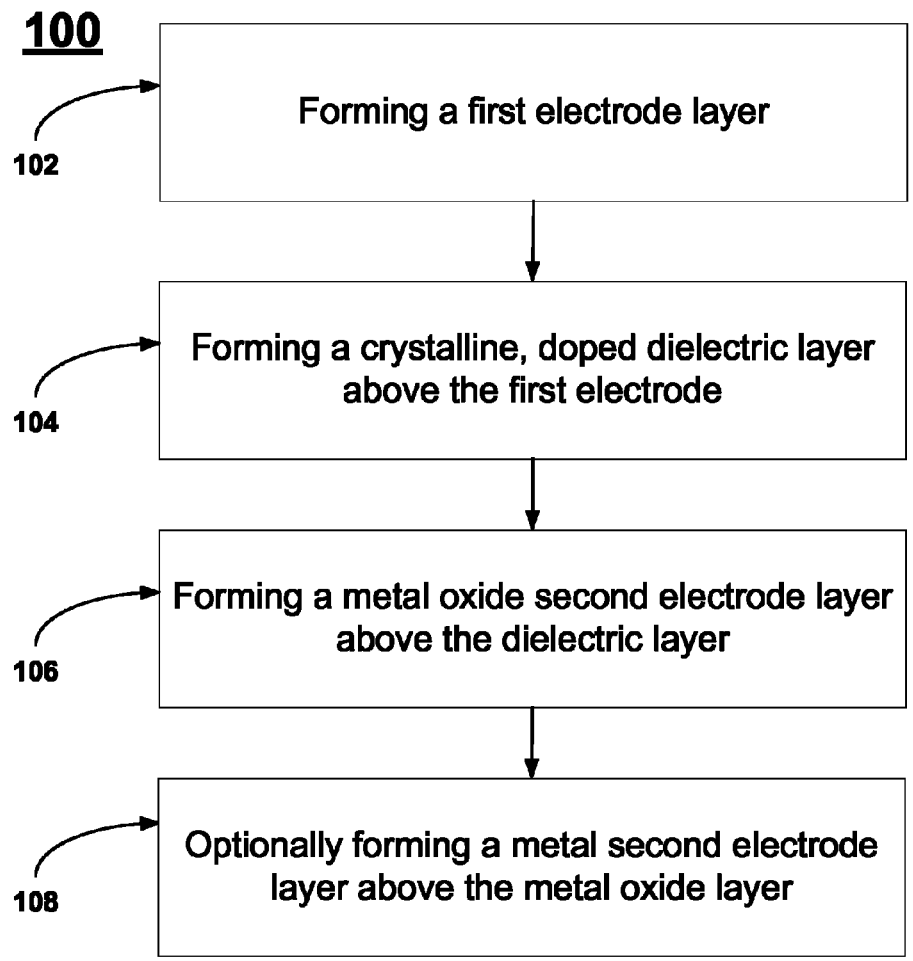
FIG. 1 illustrates a flow chart illustrating a method for fabricating a DRAM capacitor stack in accordance with some embodiments of the present invention.

FIG. 1 describes a method, 100, for fabricating a DRAM capacitor stack. The initial step, 102, comprises forming a first electrode layer above a substrate. Examples of suitable electrode materials comprise metals, metal alloys, conductive metal oxides, conductive metal silicides, conductive metal nitrides, or combinations thereof. A particularly interesting class of materials is the conductive metal oxides. Optionally, the first electrode layer can then be subjected to an annealing process (not shown). The next step, 104, comprises forming a crystalline, doped dielectric material above the first electrode layer. The next step, 106, comprises forming a metal oxide second electrode layer above the dielectric layer to complete the formation of the capacitor stack. Optionally, the first electrode layer, the dielectric layer, and the metal oxide second electrode layer can then be subjected to an annealing process (not shown). The next step, 108, comprises an optional step of forming a metal second electrode layer on the metal oxide second electrode (if the resistivity of the metal oxide second electrode layer is not low enough) to complete the formation of the capacitor stack.

Those skilled in the art will appreciate that each of the first electrode layer, the dielectric layer, the metal oxide second layer, and the metal second electrode layer used in the DRAM MIM capacitor may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the DRAM capacitor structure, ALD, PE-ALD, AVD, or CVD are preferred methods of formation. However, any of these techniques are suitable for forming each of the various layers discussed below. Those skilled in the art will appreciate that the teachings described below are not limited by the technology used for the deposition process.

Figure 2:
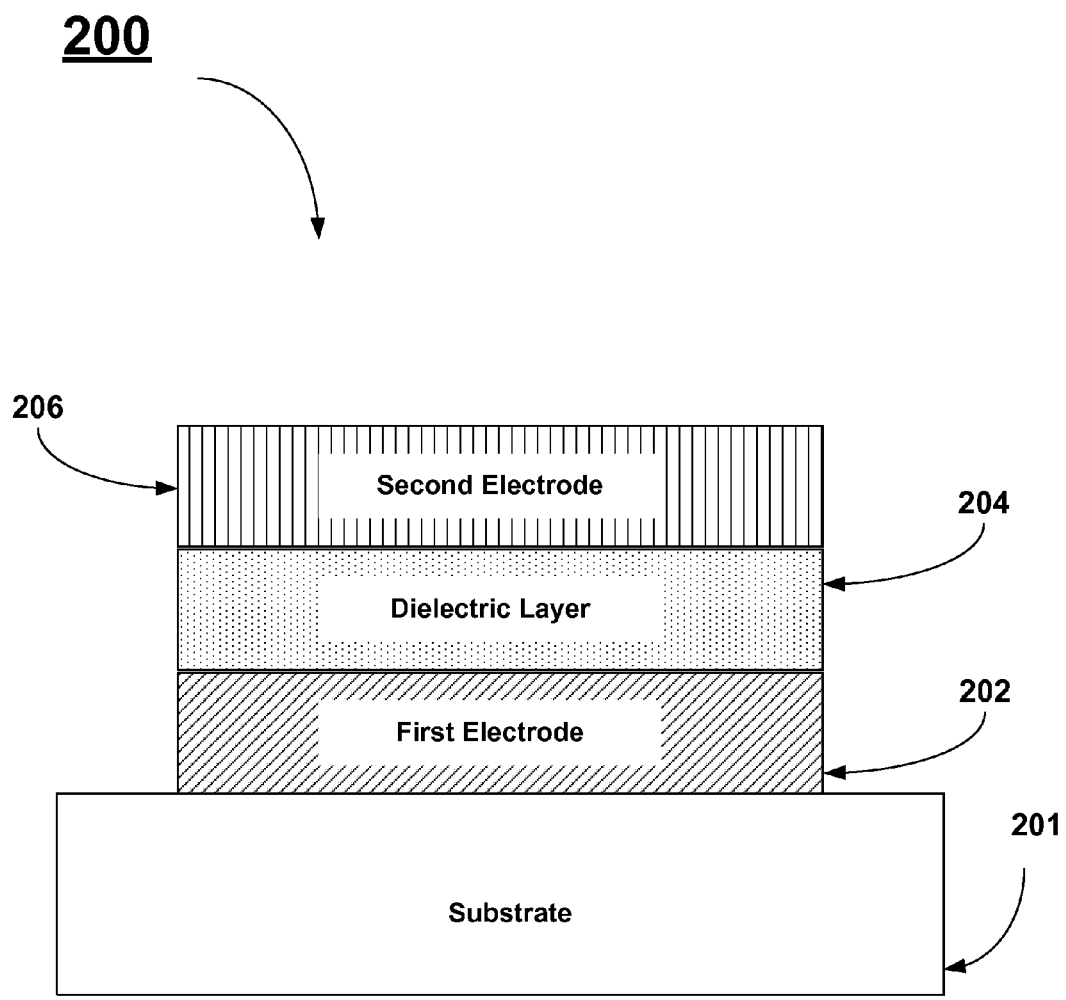
FIG. 2 illustrates a simplified cross-sectional view of a DRAM capacitor stack fabricated in accordance with some embodiments of the present invention.

FIG. 2 illustrates a simple capacitor stack, 200, consistent with a DRAM MIM capacitor stack according to some embodiments of the present invention comprising a crystalline metal oxide first electrode layer, a crystalline, doped high k dielectric layer, and a metal oxide second electrode layer. First electrode layer, 202, is formed above substrate, 201. Generally, the substrate has already received several processing steps in the manufacture of a full DRAM device. First electrode layer, 202, comprises one of metals, metal alloys, conductive metal oxides, conductive metal nitrides, conductive metal silicides, or combinations thereof, etc. For this example, first electrode layer, 202, comprises a conductive metal oxide that may serve to promote the rutile phase of $TiO_2$. Examples of such conductive metal oxides include the conductive compounds of chromium oxide, cobalt oxide, iridium oxide, manganese oxide, molybdenum oxide, tungsten oxide, rhodium oxide, ruthenium oxide, or tin oxide. A specific electrode material of interest is the crystalline $MoO_2$ compound of molybdenum dioxide.

Optionally, first electrode layer, 202, can be annealed to crystallize the material. In the case of crystalline $MoO_2$, it is advantageous to anneal the first electrode layer in a reducing atmosphere such as Ar, $N_2$, or forming gas to prevent the formation of oxygen-rich compounds as discussed previously.

In one example of a DRAM MIM capacitor stack comprising crystalline metal oxide electrode layers and a doped high k dielectric layer, a first electrode comprising between about 5 nm and about 10 nm of molybdenum oxide is formed above a substrate. The molybdenum oxide electrode material is formed at a process temperature between about 125 C and 400 C using an ALD process technology. Optionally, the substrate with the first electrode is then annealed in a reducing atmosphere comprising between about 1% and about 20% $H_2$ in $N_2$ and advantageously between about 5% and about 10% $H_2$ in $N_2$ between 400 and 520 C for between about 1 millisecond and about 60 minutes as discussed previously.

In the next step, dielectric layer, 204, would then be formed above the annealed first electrode layer, 202. A wide variety of dielectric materials have been targeted for use in DRAM capacitors. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, or doped versions of the same. These dielectric materials may be formed as a single layer or may be formed as a hybrid or nanolaminate structure. A specific dielectric material of interest is $TiO_2$ doped with one of Al, Ce, Co, Er, Ga, Gd, Ge, Hf, In, La, Lu, Mg, Mn, Nd, Pr, Sc, Si, Sn, Sr, Y, Zr, or combinations thereof. A specific dielectric material of interest is $TiO_2$ doped with $Al_2O_3$ to between about 5 atomic % and about 15 atomic % Al (Al/(Al+Ti) atomic %).

In a specific example, the, doped dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with $Al_2O_3$ at a concentration between about 5 atomic % and about 15 atomic % Al.

The $TiO_2$ dielectric layer is formed at a process temperature between about 200 C and 350 C using an ALD process technology.

In the next step, metal oxide second electrode layer, 206, would then be formed above the crystalline, doped dielectric layer, 204 to complete the formation of the capacitor stack. Advantageously, the metal oxide layer has a rutile or distorted rutile crystal structure that is compatible with the rutile crystal structure of the doped $TiO_2$ dielectric layer. The crystal structures of the two materials would be considered to be compatible if one of their lattice parameters were within about 10% of each other. Examples of such a metal oxide second electrode layer include the conductive compounds of chromium oxide, cobalt oxide, iridium oxide, manganese oxide, molybdenum oxide, tungsten oxide, rhodium oxide, ruthenium oxide, or tin oxide. A specific electrode material of interest is the crystalline $MoO_2$ compound of molybdenum dioxide. The use of these materials as the second electrode is similar to their use as the first electrode layer. Data indicates that second electrode materials that have a crystal structure that is compatible with the rutile crystal structure of the doped $TiO_2$ dielectric layer lower the EOT of the capacitor. This crystal structure compatibility will be referred to as "reverse templating" herein to indicate that the second electrode exhibits a structural synergy with the underlying dielectric material. Without being limited by theory, it is believed that the structural synergy between the dielectric layer and the reverse templating second electrode results in a more strongly polarized dielectric layer and reduces the formation or width of any dead layer that typically forms at the interface, thus reducing the EOT. Additionally, the crystal structure compatibility may result in fewer numbers of defects at the interface which may assist in lowering the leakage current. The capacitor stack may receive a PMA treatment as discussed previously.

Figure 3:
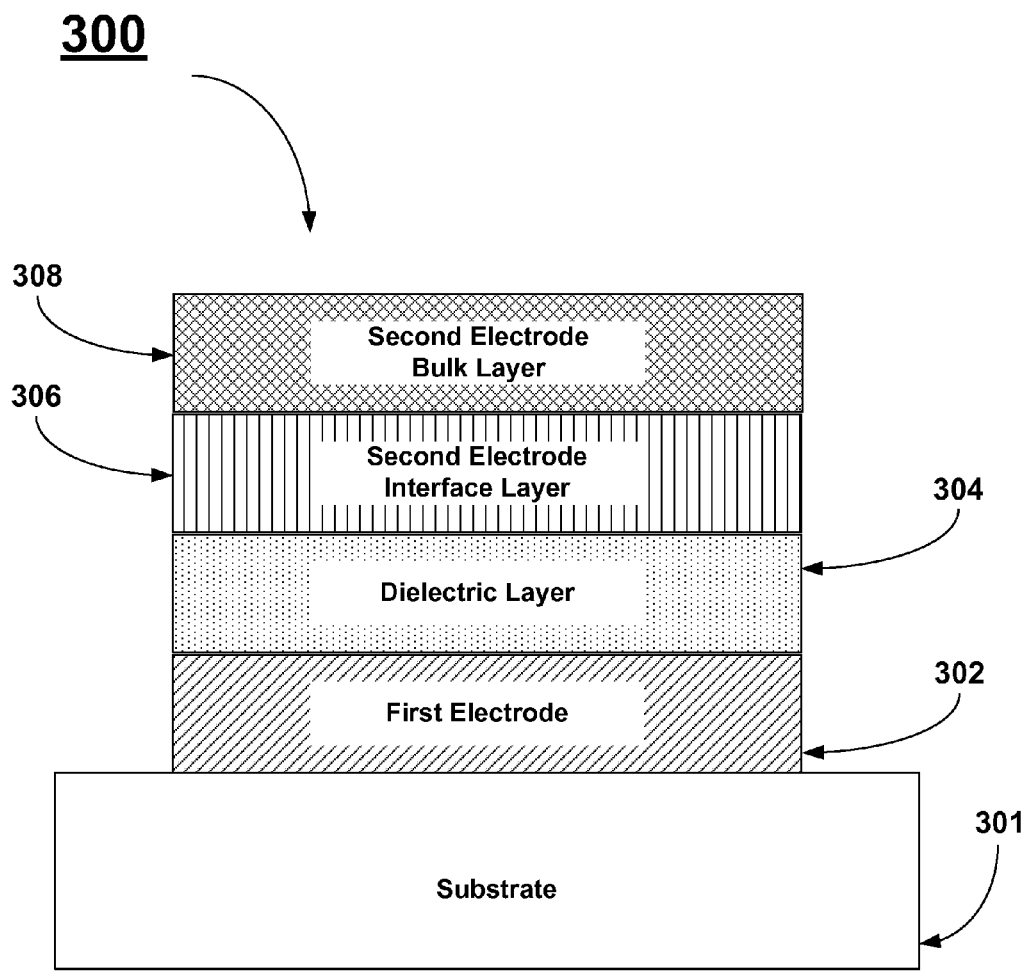
FIG. 3 illustrates a simplified cross-sectional view of a DRAM capacitor stack fabricated in accordance with some embodiments of the present invention.

FIG. 3 illustrates a simple capacitor stack, 300, consistent with a DRAM MIM capacitor stack according to some embodiments of the present invention comprising a crystalline metal oxide first electrode layer, a crystalline, doped high k dielectric layer, and a metal oxide second electrode layer. First electrode layer, 302, is formed above substrate, 301. Generally, the substrate has already received several processing steps in the manufacture of a full DRAM device. First electrode layer, 302, comprises one of metals, metal alloys, conductive metal oxides, conductive metal nitrides, conductive metal silicides, or combinations thereof, etc. For this example, first electrode layer, 302, comprises a conductive metal oxide that may serve to promote the rutile phase of $TiO_2$. Examples of such conductive metal oxides include the conductive compounds of chromium oxide, cobalt oxide, iridium oxide, manganese oxide, molybdenum oxide, tungsten oxide, rhodium oxide, ruthenium oxide, or tin oxide. A specific electrode material of interest is the crystalline $MoO_2$ compound of molybdenum dioxide.

Optionally, first electrode layer, 302, can be annealed to crystallize the material. In the case of crystalline $MoO_2$, it is advantageous to anneal the first electrode layer in a reducing atmosphere such as Ar, $N_2$, or forming gas to prevent the formation of oxygen-rich compounds as discussed previously.

In one example of a DRAM MIM capacitor stack comprising crystalline metal oxide electrode layers and a doped high k dielectric layer, a first electrode comprising between about 5 nm and about 10 nm of molybdenum oxide is formed above a substrate. The molybdenum oxide electrode material is formed at a process temperature between about 125 C and 400 C using an ALD process technology. Optionally, the substrate with the first electrode is then annealed in a reducing atmosphere comprising between about 1% and about 20% $H_2$ in $N_2$ and advantageously between about 5% and about 10% $H_2$ in $N_2$ between 400 and 520 C for between about 1 millisecond and about 60 minutes as discussed previously.

In the next step, dielectric layer, 304, would then be formed above the annealed first electrode layer, 302. A wide variety of dielectric materials have been targeted for use in DRAM capacitors. Examples of suitable dielectric materials comprise $Al_2O_3$, $BaSrTiO_x$ (BST), $HfO_2$, $HfSiO_x$, $Nb_2O_5$, $PbZrTiO_x$ (PZT), $SiO_2$, a bilayer of $SiO_2$ and $Si_xN_y$, SiON, $SrTiO_3$ (STO), $Ta_2O_5$, $TiO_2$, $ZrO_2$, or doped versions of the same. These dielectric materials may be formed as a single layer or may be formed as a hybrid or nanolaminate structure. A specific dielectric material of interest is $TiO_2$ doped with one of Al, Ce, Co, Er, Ga, Gd, Ge, Hf, In, La, Lu, Mg, Mn, Nd, Pr, Sc, Si, Sn, Sr, Y, Zr, or combinations thereof. A specific dielectric material of interest is $TiO_2$ doped with $Al_2O_3$ to between about 5 atomic % and about 15 atomic % Al (Al/(Al+Ti) atomic %).

In a specific example, the doped dielectric layer comprises between about 6 nm to about 10 nm of $TiO_2$ wherein at least 30% of the $TiO_2$ is present in the rutile phase. Generally, the $TiO_2$ dielectric layer may either be a single film or may comprise a nanolaminate. Advantageously, the $TiO_2$ material is doped with $Al_2O_3$ at a concentration between about 5 atomic % and about 15 atomic % Al. The $TiO_2$ dielectric layer is formed at a process temperature between about 200 C and 350 C using an ALD process technology.

In the next step, metal oxide second electrode interface layer, 306, would then be formed above the crystalline, doped dielectric layer, 304. Advantageously, the metal oxide interface layer has a crystal structure that is rutile or distorted rutile and is compatible with the rutile crystal structure of the doped $TiO_2$ dielectric layer. Examples of such a metal oxide second electrode interface layer include the conductive compounds of chromium oxide, cobalt oxide, iridium oxide, manganese oxide, molybdenum oxide, tungsten oxide, rhodium oxide, ruthenium oxide, or tin oxide. A specific interface layer electrode material of interest is the crystalline $MoO_2$ compound of molybdenum dioxide. The use of these materials as the second electrode interface layer is similar to their use as the first electrode layer. Data indicates that second electrode materials that have a crystal structure that is compatible with the rutile crystal structure of the doped $TiO_2$ dielectric layer lower the leakage current of the capacitor.

In the next step, metal oxide second electrode bulk layer, 308, would then be formed above the second electrode interface layer, 306 to complete the formation of the capacitor stack. This layer may be used if the resistivity of the second electrode interface layer is not low enough to meet the power and speed requirements for the device. Typically, this layer is a low resistivity metal or metal alloy. Examples of suitable materials for the second electrode bulk layer comprise Co, CoN, Ir, MoN, $MoO_2$, Ni, NiN, NiO, Pt, Pd, Ru, $RuO_2$, TiN, VN, WN, or combinations thereof. The capacitor stack may receive a PMA treatment as discussed previously.

Figure 4:
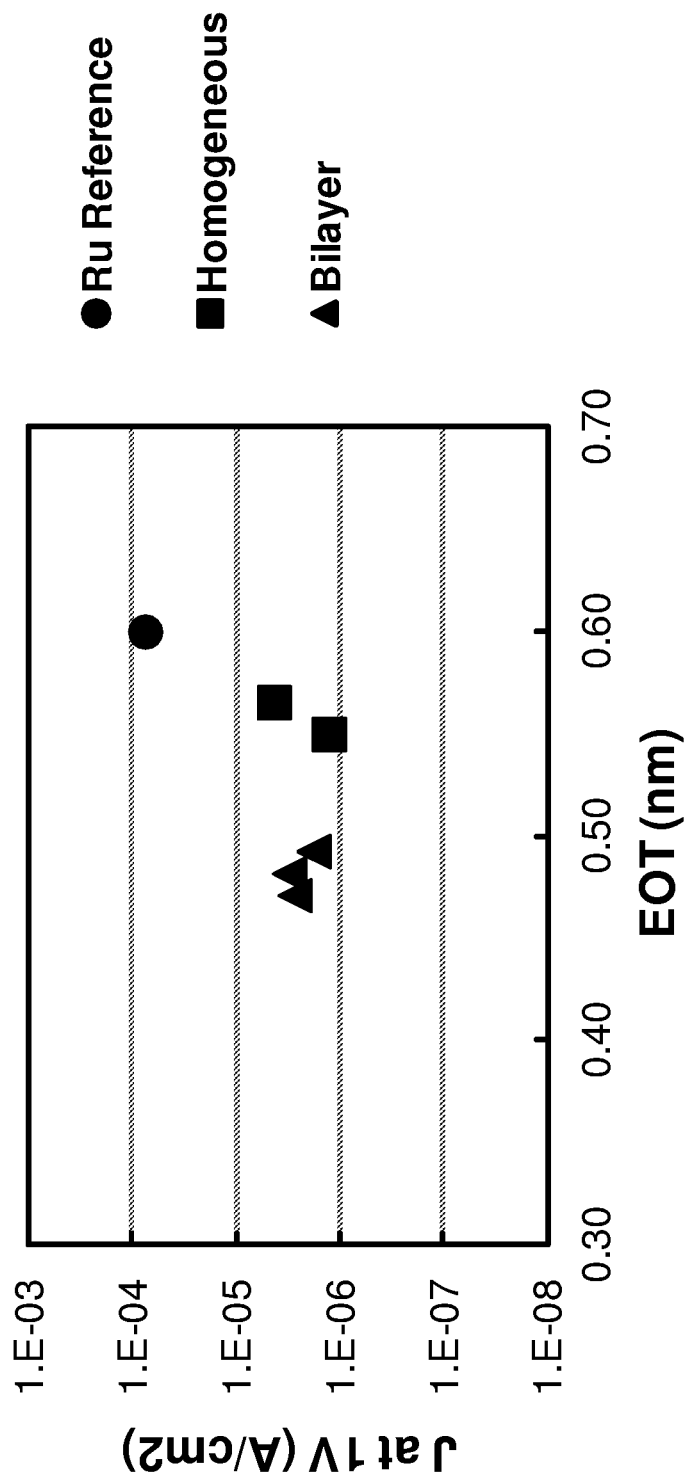
FIG. 4 presents data for leakage current versus EOT for capacitors formed in accordance with some embodiments of the present invention.

As mentioned previously, the integration of $MoO_2$ as a second electrode material is challenging and currently the second electrode material is typically Ru. Because of the common metal element, $RuO_2$ is easier to integrate and can serve as a proxy to demonstrate the benefits of some embodiments of the present invention. FIG. 4 presents leakage current versus EOT data from three capacitor stacks. The Ru reference capacitors (circles) comprise a $MoO_2$ first electrode layer, a doped $TiO_2$ high k dielectric layer, and a Ru second electrode layer. The homogeneous capacitors (squares) comprise a $MoO_2$ first electrode layer, a doped $TiO_2$ high k dielectric layer, and a single $RuO_2$ second electrode layer, similar to the structure in FIG. 2. The bilayer capacitors (triangles) comprise a $MoO_2$ first electrode layer, a doped $TiO_2$ high k dielectric layer, and a bilayer of $RuO_2$ and Ru metal second electrode layer similar to the structure in FIG. 3. For all of the samples, the leakage current data was acquired after the deposition of the second electrode. This was done to ensure that any effects that were observed were due to the electrode material and not due to other factors such as PMA treatments, etc. This explains the relatively high leakage current for these samples. A PMA treatment would normally lower the leakage current for these samples. The Ru reference capacitors exhibited the highest EOT values and the highest leakage current. The homogeneous capacitors exhibited lower EOT values and also exhibited lower leakage current.

The bilayer capacitors exhibited lower EOT values and exhibited leakage current values that were similar to the homogeneous capacitors. The capacitor stack and the processing were consistent for all of the samples except for the second electrode layer material. Therefore, the benefits of having a second electrode layer that has a crystal structure that is rutile or distorted rutile and is compatible with the rutile crystal structure of the doped $TiO_2$ dielectric layer is clearly demonstrated.

Figure 5:
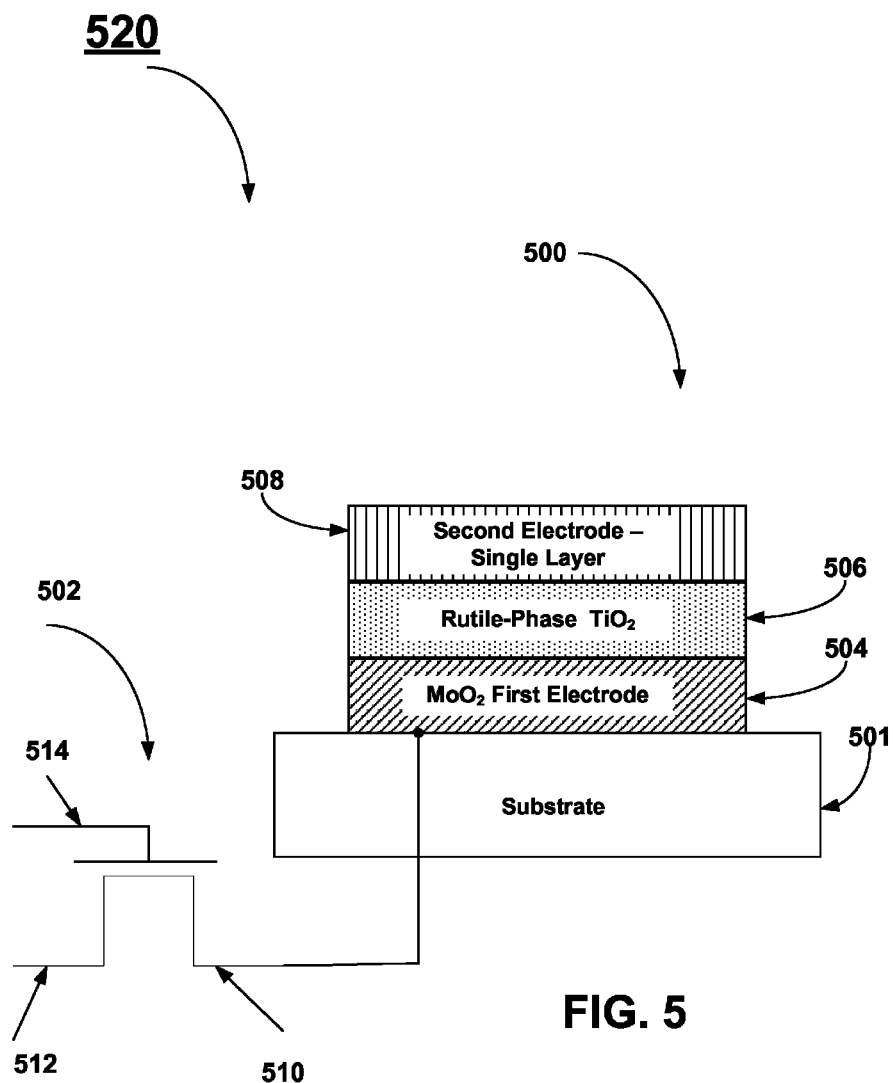
FIG. 5 illustrates a simplified cross-sectional view of a DRAM memory cell fabricated in accordance with some embodiments of the present invention.

An example of a specific application of some embodiments of the present invention is in the fabrication of capacitors used in the memory cells in DRAM devices. DRAM memory cells effectively use a capacitor to store charge for a period of time, with the charge being electronically "read" to determine whether a logical "one" or "zero" has been stored in the associated cell. Conventionally, a cell transistor is used to access the cell. The cell transistor is turned "on" in order to store data on each associated capacitor and is otherwise turned "off" to isolate the capacitor and preserve its charge. More complex DRAM cell structures exist, but this basic DRAM structure will be used for illustrating the application of this disclosure to capacitor manufacturing and to DRAM manufacturing. FIG. 5 is used to illustrate one DRAM cell, 520, manufactured using a structure as discussed previously in reference to FIG. 2. The cell, 520, is illustrated schematically to include two principle components, a cell capacitor, 500, and a cell transistor, 502. The cell transistor is usually constituted by a MOS transistor having a gate, 514, source, 510, and drain, 512. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 500, comprises a first electrode layer, 504, formed above substrate, 501. The first electrode layer, 504, is connected to the source or drain of the cell transistor, 502. For illustrative purposes, the first electrode has been connected to the source, 510, in this example. As discussed previously, first electrode layer, 504, may be subjected to an anneal in a reducing atmosphere before the formation of the dielectric layer if the first electrode layer is a conductive metal oxide such as $MoO_2$. Crystalline, doped high k dielectric layer, 506, is formed above the first electrode layer. If the crystalline, doped high k dielectric layer is $TiO_2$, then the dielectric layer will be lightly or non-doped so that the rutile phase of $TiO_2$ can be formed above the first electrode. Typical dopants for $TiO_2$ comprise Al, Ce, Co, Er, Ga, Gd, Ge, Hf, In, La, Lu, Mg, Mn, Nd, Pr, Sc, Si, Sn, Sr, Y, Zr, or combinations thereof. Typically, the first electrode layer and the high k dielectric layer are then subjected to a PDA treatment. Metal oxide second electrode layer, 508, is formed above the dielectric layer. Advantageously, the metal oxide interface layer has a crystal structure that is rutile or distorted rutile and is compatible with the rutile crystal structure of the doped $TiO_2$ dielectric layer. Examples of such a metal oxide second electrode interface layer include the conductive compounds of chromium oxide, cobalt oxide, iridium oxide, manganese oxide, molybdenum oxide, tungsten oxide, rhodium oxide, ruthenium oxide, or tin oxide. This completes the formation of the capacitor stack. Typically, the capacitor stack is then subjected to a PMA treatment.

Figure 6:
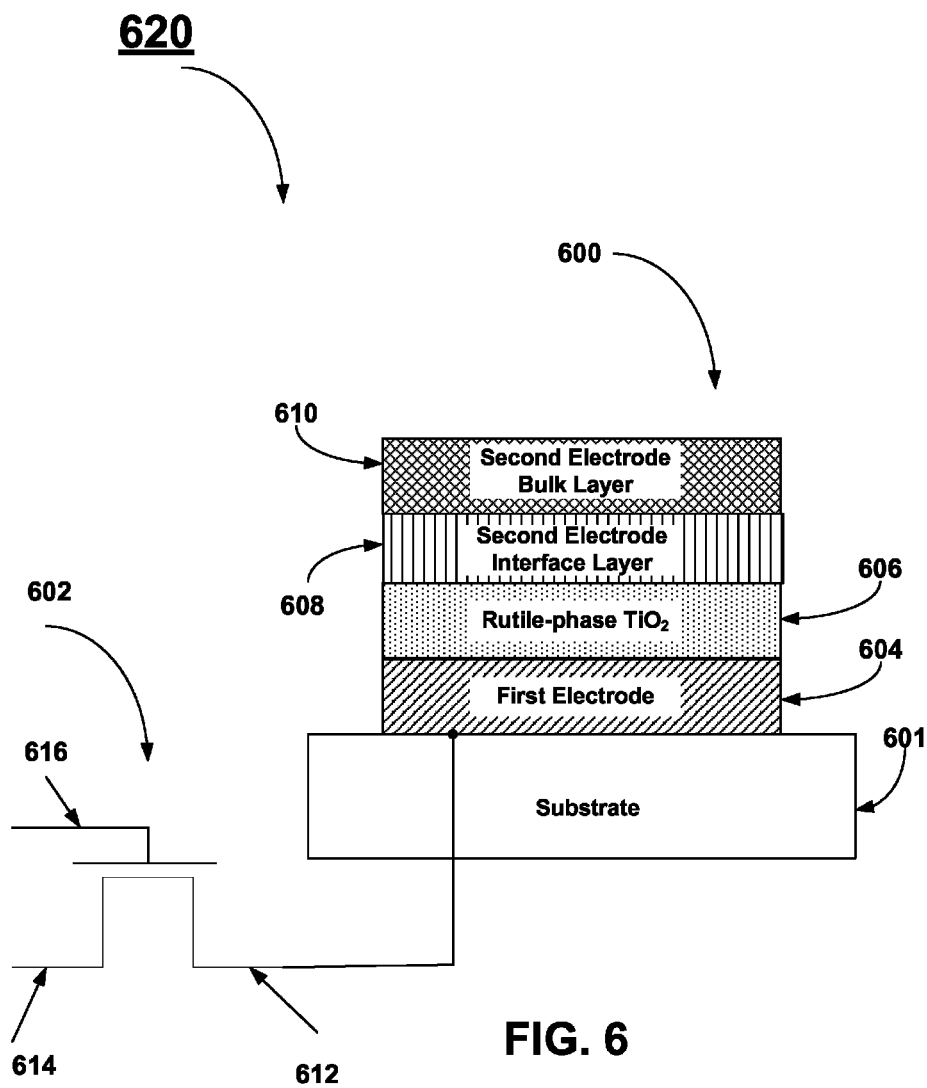
FIG. 6 illustrates a simplified cross-sectional view of a DRAM memory cell fabricated in accordance with some embodiments of the present invention.

Another example of a specific application of some embodiments of the present invention is in the fabrication of capacitors used in the memory cells in DRAM devices. FIG. 6 is used to illustrate one DRAM cell, 620, manufactured using a structure as discussed previously in reference to FIG. 3. The cell, 620, is illustrated schematically to include two principle components, a cell capacitor, 600, and a cell transistor, 602. The cell transistor is usually constituted by a MOS transistor having a gate, 616, source, 612, and drain, 614. The gate is usually connected to a word line and one of the source or drain is connected to a bit line. The cell capacitor has a lower or storage electrode and an upper or plate electrode. The storage electrode is connected to the other of the source or drain and the plate electrode is connected to a reference potential conductor. The cell transistor is, when selected, turned "on" by an active level of the word line to read or write data from or into the cell capacitor via the bit line.

As was described previously, the cell capacitor, 600, comprises a first electrode layer, 604, formed above substrate, 601. The first electrode layer, 604, is connected to the source or drain of the cell transistor, 602. For illustrative purposes, the first electrode has been connected to the source, 612, in this example. As discussed previously, first electrode layer, 604, may be subjected to an anneal in a reducing atmosphere before the formation of the dielectric layer if the first electrode layer is a conductive metal oxide such as $MoO_2$. Crystalline, doped high k dielectric layer, 606, is formed above the first electrode layer. If the crystalline, doped high k dielectric layer is $TiO_2$, then the dielectric layer will be lightly or non-doped so that the rutile phase of $TiO_2$ can be formed above the first electrode. Typical dopants for $TiO_2$ comprise Al, Ce, Co, Er, Ga, Gd, Ge, Hf, In, La, Lu, Mg, Mn, Nd, Pr, Sc, Si, Sn, Sr, Y, Zr, or combinations thereof. Typically, the first electrode layer and the high k dielectric layer are then subjected to a PDA treatment. Metal oxide second electrode interface layer, 608, is formed above the dielectric layer. Advantageously, the metal oxide interface layer has a crystal structure that is rutile or distorted rutile and is compatible with the rutile crystal structure of the doped $TiO_2$ dielectric layer. Examples of such a metal oxide second electrode interface layer include the conductive compounds of chromium oxide, cobalt oxide, iridium oxide, manganese oxide, molybdenum oxide, tungsten oxide, rhodium oxide, ruthenium oxide, or tin oxide. Second electrode bulk layer, 610, would then be formed above the second electrode interface layer, 608 to complete the formation of the capacitor stack. This layer may be used if the resistivity of the second electrode interface layer is not low enough to meet the power and speed requirements for the device. Typically, this layer is a low resistivity metal or metal alloy. Examples of suitable materials for the second electrode bulk layer comprise Co, CoN, Ir, MoN, $MoO_2$, Ni, NiN, NiO, Pt, Pd, Ru, $RuO_2$, TiN, VN, WN, or combinations thereof. Typically, the capacitor stack is then subjected to a PMA treatment.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method for forming a capacitor stack, the method comprising:
   forming a first electrode layer above a substrate;
   forming a dielectric layer above the first electrode layer, wherein the dielectric layer has a rutile crystal structure; and
   forming a metal oxide second electrode layer above the dielectric layer,
      wherein the metal oxide second electrode layer comprises molybdenum oxide having a rutile or distorted rutile crystal structure, and
      wherein forming the metal oxide second electrode layer comprises reverse templating such that the metal oxide second electrode layer exhibits a structural synergy with the dielectric layer.

2. The method of claim 1 wherein a lattice parameter of the metal oxide second electrode layer is within about 10% of a lattice parameter of the dielectric layer.

3. The method of claim 1 wherein the first electrode layer comprises one of a metal, metal alloy, conductive metal oxide, conductive metal silicide, conductive metal carbides, conductive metal nitride, or combinations thereof.

4. The method of claim 3 wherein the first electrode layer comprises one of molybdenum oxide, tungsten oxide, ruthenium oxide, iridium oxide, chromium oxide, manganese oxide, tin oxide, or cobalt oxide.

5. The method of claim 4 wherein the first electrode layer comprises molybdenum oxide.

6. The method of claim 1 wherein the dielectric layer comprises a dopant.

7. The method of claim 6 wherein the dielectric layer comprises TiO2 and the dopant comprises one of Al, Ce, Co, Er, Ga, Gd, Ge, Hf, In, La, Lu, Mg, Mn, Nd, Pr, Sc, Si, Sn, Sr, Y, Zr, or combinations thereof.

8. The method of claim 1 wherein the first electrode layer is subjected to an annealing treatment before the formation of the dielectric layer.

9. The method of claim 1 wherein the first electrode layer, dielectric layer, and metal oxide second electrode layer are subjected to an annealing treatment after the formation of the metal oxide second electrode layer.

10. The method of claim 1, wherein the dielectric layer comprises titanium oxide doped with aluminum oxide to between, and wherein a concentration of aluminum within the dielectric layer relative to a total amount of metal (Al/(Al+Ti)) is about 5 atomic % and about 15 atomic %.

11. The method of claim 1, wherein the dielectric layer comprises titanium oxide ($TiO_2$) and wherein at least 30% of titanium oxide is present in a rutile phase.

12. A method for forming a capacitor stack, the method comprising:
   forming a first electrode layer above a substrate;
   forming a dielectric layer above the first electrode layer, wherein the dielectric layer has a rutile crystal structure;
   forming a metal oxide second electrode interface layer above the dielectric layer,
      wherein the metal oxide second electrode interface layer comprises molybdenum oxide having a rutile or distorted rutile crystal structure,
      wherein forming the metal oxide second electrode layer comprises reverse templating such that the metal oxide second electrode layer exhibits a structural synergy with the dielectric layer; and
   forming a second electrode bulk layer above the metal oxide second electrode interface layer.

13. The method of claim 12, wherein a lattice parameter of the metal oxide second electrode interface layer is within about 10% of a lattice parameter of the dielectric layer.

14. The method of claim 12 wherein the first electrode layer comprises is one of a metal, metal alloy, conductive metal oxide, conductive metal silicide, conductive metal carbides, conductive metal nitride, or combinations thereof.

15. The method of claim 14 wherein the first electrode layer comprises one of molybdenum oxide, tungsten oxide, ruthenium oxide, iridium oxide, chromium oxide, manganese oxide, tin oxide, or cobalt oxide.

16. The method of claim 15 wherein the conductive metal oxide comprises molybdenum oxide.

17. The method of claim 12 wherein the dielectric layer comprises a dopant.

18. The method of claim 17 wherein the dielectric layer comprises TiO2 and the dopant comprises one of Al, Ce, Co, Er, Ga, Gd, Ge, Hf, In, La, Lu, Mg, Mn, Nd, Pr, Sc, Si, Sn, Sr, Y, Zr, or combinations thereof.

19. The method of claim 12 wherein the first electrode layer is subjected to an annealing treatment before the formation of the dielectric layer.

20. The method of claim 12 wherein the second electrode bulk layer comprises one of Co, CoN, Ir, MoN, MoO2, Ni, NiN, NiO, Pt, Pd, Ru, RuO2, TiN, VN, WN, or combinations thereof.

21. The method of claim 12 wherein the first electrode layer, dielectric layer, metal oxide second electrode interface layer, and second electrode bulk layer are subjected to an annealing treatment after the formation of the second electrode bulk layer.

* * * * *